United States Patent [19]

Valdettaro

[11] 4,158,826

[45] Jun. 19, 1979

[54] OPERATOR CONTROLLABLE DETENT MECHANISM FOR TELEVISION TUNERS

[75] Inventor: Alarico A. Valdettaro, Bloomington, Ind.

[73] Assignee: Sarkes Tarzian, Inc., Bloomington, Ind.

[21] Appl. No.: 896,638

[22] Filed: Apr. 17, 1978

[51] Int. Cl.² .......................... H03J 1/00; H03J 5/00; F16H 35/18
[52] U.S. Cl. ........................................ 334/88; 334/47; 74/10.41
[58] Field of Search ............... 334/47, 51, 50, 88; 74/10.41

[56] References Cited

U.S. PATENT DOCUMENTS

| 3,172,062 | 3/1965 | Valdettaro et al. ............... 74/10.41 |
| 3,477,299 | 11/1969 | Speer et al. ....................... 74/10.41 |
| 3,593,226 | 7/1971 | Weigel ................................ 334/88 |
| 3,757,227 | 9/1973 | Weigel ................................ 334/50 |
| 3,973,229 | 8/1976 | Weigel ................................ 74/10.41 |

Primary Examiner—Alfred E. Smith
Assistant Examiner—Harry E. Barlow
Attorney, Agent, or Firm—Mason, Kolehmainen, Rathburn & Wyss

[57] ABSTRACT

An operator-controllable detent mechanism is provided for a combination VHF-UHF television tuner. Separate torsionally-loaded detent springs are provided for two detent wheels which are mounted on the common station selector shaft of the tuner. A manually-operable control member concentric with the selector shaft is employed selectively to remove the torsional load on one detent member or the other so that the common selector shaft may be detented for combined VHF-UHF reception, VHF only reception or UHF only reception.

20 Claims, 7 Drawing Figures

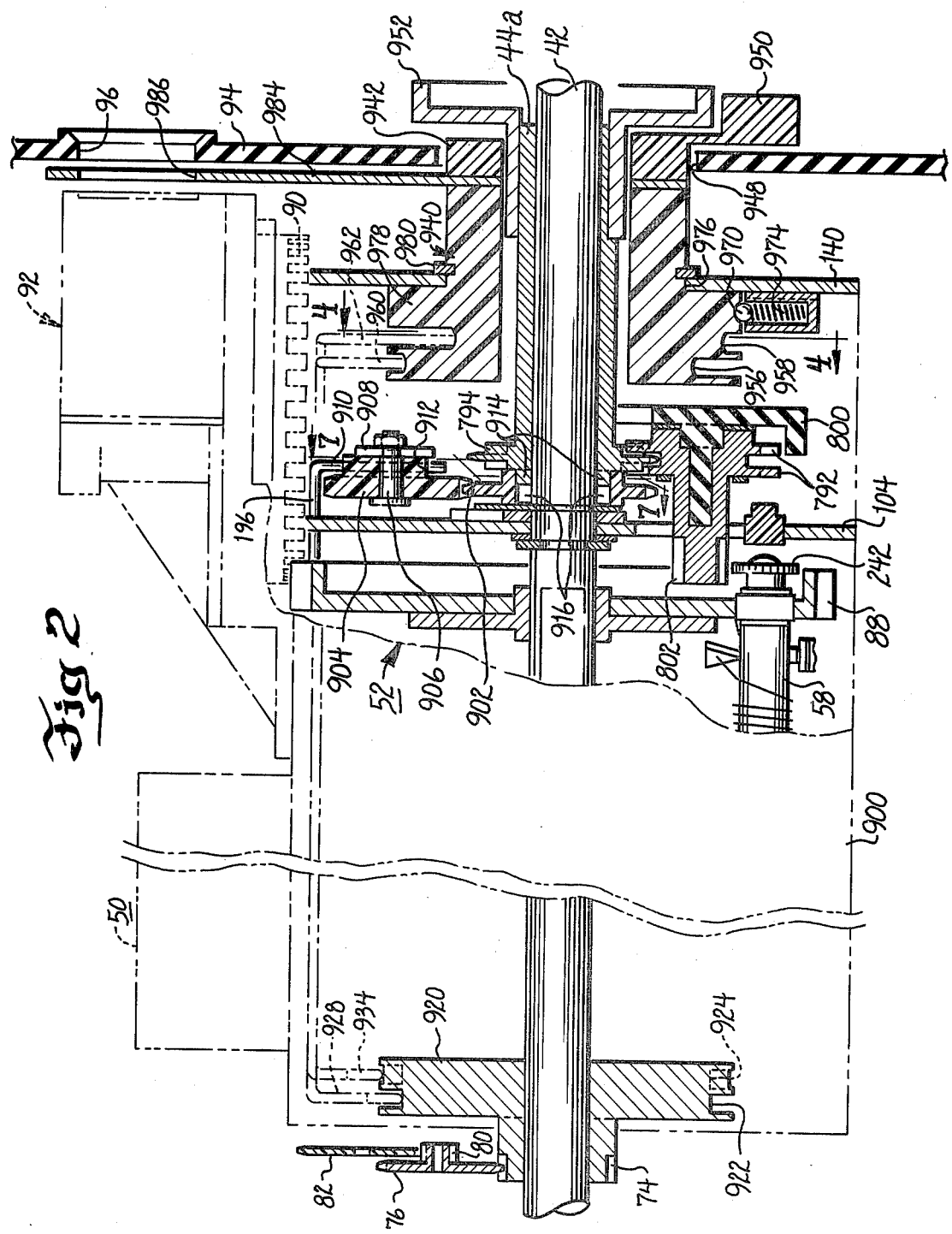

OPERATOR CONTROLLABLE DETENT MECHANISM FOR TELEVISION TUNERS

The present invention relates to television tuners, and more particularly, to a detent mechanism which may be employed selectively to control the detent action of the channel selector shaft of such tuners.

While the present invention is of general application, it is particularly suitable for use in and will be described in connection with a combination VHF-UHF tuner of the type shown and described in Valdettaro U.S. application Ser. No. 776,890, filed Mar. 11, 1977 and assigned to the same assignee as the present invention. In said copending U.S. Valdettaro application, a common station selector shaft is employed to select both VHF and UHF television stations. The common selector shaft is provided with twenty-four detent positions, the twelve VHF stations being repeatedly received in twelve alternate ones of the twenty-four detent positions while the seventy UHF stations are selected at the detent positions between said alternate detent positions by rotation of the common selector shaft a number of revolutions.

While the arrangement described in said Valdettaro U.S. application is generally suitable for its intended purpose, it would be desirable, under certain conditions, for the operator to be able to modify the detent action of such tuners so that the channel selector shaft is detented to receive only VHF channels or, in the alternative, is detented to receive only UHF channels. For example, in areas where CATV is provided, the UHF channels are heterodyned to the frequency band assigned to an unused VHF channel in the area and all of the UHF stations are sent by cable along with the active VHF channels to the users in this area. Under these conditions, it would be desirable to permit the operators of television sets in such areas to modify the detent mechanism of the tuner so that the common selector shaft will be detented only in the twelve positions corresponding to the twelve VHF channels. Such an arrangement would remove any confusion which might arise from the fact that UHF channel numbers would appear alternately with VHF channel numbers in the common dial indicator since these UHF channel numbers would flash rapidly past the operator's viewing window if the common selector shaft were not detented in any of the UHF positions. On the other hand, if a television set is receiving only UHF channels, it would also be desirable to permit the operator to defeat the VHF detent positions of the common selector shaft so that this shaft could be stopped only in detent positions corresponding to UHF channels.

Various arrangements have been provided in the past for detenting the channel selector shaft of a television tuner. For example, a torsion wire spring detent arrangement has been employed in VHF tuners, as shown in the Valdettaro et al U.S. Pat. No. 3,234,801 and in UHF tuners as shown in Valdettaro U.S. Pat. No. 3,842,683, Badger U.S. Pat. No. 3,689,853 and Valdettaro U.S. Pat. No. 3,774,459. Similar torsion spring detent arrangements have been employed in combination VHF-UHF tuners, as shown, for example, in Weigel U.S. Pat. No. 3,757,227 and Speer U.S. Pat. No. 3,824,507. A single detent wheel has also been employed with a plurality of detent springs or rollers, as shown, for example, in the Weigel U.S. Pat. No. 3,593,226 and Naber et al U.S. Pat. No. 3,307,414. However, none of these prior art detent mechanisms permit the operator to modify the detent positions of the channel selector shaft so that certain detent positions of the channel selector shaft may be eliminated or disabled under the selective control of the operator.

It is, therefore, a primary object of the present invention to provide a new and improved detent mechanism for television tuners wherein one or more of the above-discussed disadvantages of prior art arrangements is eliminated.

It is another object of the present invention to provide a new and improved detent mechanism for television tuners which is controllable by the operator so that certain detent positions of the channel selector shaft may be selectively disabled or eliminated by the operator.

It is a further object of the present invention to provide a new and improved detent mechanism for television tuners wherein the detent positions corresponding to either VHF channels or UHF channels may be selectively disabled or eliminated by the operator to convert the tuner to VHF only reception or UHF only reception.

It is another object of the present invention to provide a new and improved detent mechanism for combination VHF-UHF television tuners wherein a common station selector shaft is employed to select both VHF and UHF television channels and the detent positions corresponding to either VHF channels or UHF channels may be selectively disabled or eliminated by the operator.

Briefly considered, the operator-controllable detent mechanism of the present invention includes separate torsionally-loaded detent springs for two detent wheels which are mounted on the common station selector shaft of a combination VHF-UHF tuner. A manually-operable control member concentric with the selector shaft is employed selectively to remove the torsional load on one detent member or the other so that the common selector shaft may be detented for combined VHF-UHF reception, VHF only reception or UHF only reception.

The invention, both as to its organization and method of operation, together with further objects and advantages thereof, will best be understood by reference to the following specification taken in connection with the accompanying drawings in which:

FIG. 2 is a fragmentary side elevational view, partly in section, of the tuner arrangement of FIG. 1;

Figure 7:
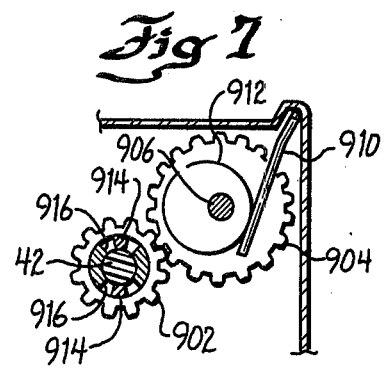
Figure 4:
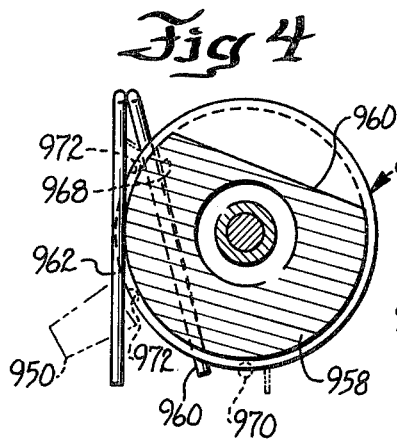
Figure 5:
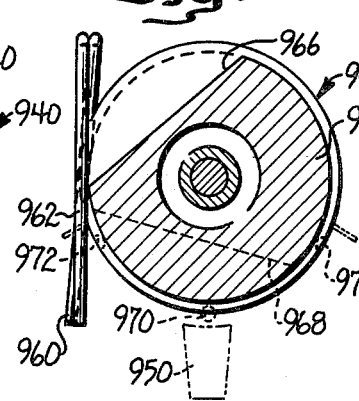
Figure 6:
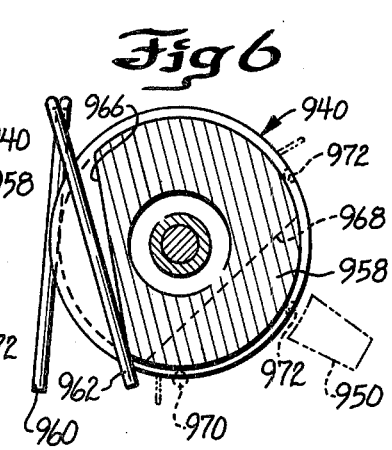

FIGS. 4, 5 and 6 are sectional views taken along the line 4—4 of FIG. 2 and showing the operator-controllable detent mechanism in various positions; and FIG. 7 is a sectional view taken along the line 7—7 of FIG. 2.

Referring now to the drawings, the operator controllable detent mechanism of the present invention is illustrated therein in conjunction with a combination VHF-UHF tuner of the type shown and described in detail in Valdettaro U.S. application Ser. No. 776,890, filed Mar. 11, 1977. While reference may be had to said Valdettaro application for a detailed description of such a tuner, for the purpose of the present invention, it may be stated that a combination VHF-UHF channel selector shaft 42 is provided which is mounted in the front wall 104 and rear wall of a VHF tuner portion 52. The shaft 42 supports a turret comprising a plurality of VHF tuning sticks 58 which are selectively moved into engagement with a suitable stator bar (not shown) in alternate detent positions of the shaft 42 for reception of a particular VHF station. The common selector shaft 42 is also connected through the gears 74, 76, 80 and 82 to a UHF tuner 50. A main frame 900 is provided in which the VHF tuner portion 52 is mounted and on which the UHF tuner 50 is also mounted. The main frame 900 also supports a strip type dial indicator 92 which is provided with a crown gear 90 driven from the shaft 42 through the gear 88 which is mounted on the shaft 42 inside the VHF tuner portion 52. The dial indicator 92 is provided with an indicator strip on which the VHF channel numbers are repeated in association with different groups of UHF stations so that as the shaft 42 is rotated through a series of revolutions, the entire UHF television band may be covered while permitting reception of any VHF channel by manipulation of the shaft 42 less than one full revolution. These VHF and UHF channel numbers are visible through a viewing window 96 provided in the front panel 94 of the television cabinet in which the combination VHF-UHF tuner is mounted. A combination VHF-UHF fine tuning shaft 44a is rotatably mounted on the selector shaft 42 and is employed for both VHF and UHF fine tuning.

In the illustrated embodiment of the present invention, the VHF fine tuning arrangement is of the turn-to-engage memory type such as shown in FIG. 54 of Valdettaro U.S. application Ser. No. 776,890 and also described in detail in Badger U.S. Pat. No. 3,183,726. More particularly, a first driving gear 794 is formed integrally with the fine tuning shaft 44a and is adapted to engage the split gear 792 which is rotatably mounted on a pivotally mounted lever 800. A gear 802 is formed integrally with the rotatably mounted gear 792 and is adapted to engage the gear 242 mounted on the end of a tuning screw inserted in the end of the active VHF tuning stick 58. Accordingly, when the shaft 44a is rotated, the lever 800 is moved outwardly away from the selector shaft 42 so that the gears 802 and 242 are engaged and upon further rotation of the shaft 44a, the tuning screw 242 may be rotated so as to tune the stick 58 to the exact frequency of the VHF station being received. As soon as the shaft 44a is released, the spring biased lever 800 returns to the position shown in FIG. 2 in which the gear 802 is moved away from the path of the tuning screws 42.

In the illustrated embodiment of the present invention, the UHF fine tuning arrangement is somewhat different from that disclosed in Valdettaro U.S. application Ser. No. 776,890. More particularly, a gear 902 is rotatably mounted on the selector shaft 42 beyond the rear end of the fine tuning shaft 44a and is in engagement with the gear 904 which is rotatably mounted on a stud 906 secured to a tab portion 908 of the main frame 900. A UHF fine tuning rod 196 is provided with a right angle end portion 910 which is biased into engagement with an eccentric cam 912 formed integrally with one face of the gear 904. The gear 902 is arranged to be driven from the fine tuning shaft 44a by means of a pair of lug portions 914 which extend rearwardly from the end of the shaft 44a into arcuate slots 916 formed in the gear 902 (FIG. 7). Accordingly, when the shaft 44a is rotated, the gear 902 may be rotated in either direction by engagement of the lugs 914 with one end or the other of the slots 916 so that the gear 904 and the eccentric cam 912 are also rotated. Rotation of the cam 912 causes the end portion 910 of the control rod 196 to pivot. The other end of the rod 196 is provided with an offset portion movable within the coil of the UHF oscillator in the UHF tuner 50, as described in detail in Valdettaro U.S. application Ser. No. 776,890. Accordingly, rotation of the shaft 44a is effective to rotate the UHF fine tuning control rod 196 and provide a UHF fine tuning function. This UHF fine tuning arrangement of the present invention has the advantage that the UHF fine tuning cam 912 and central rod 196 are mounted on the main frame 900 on which the UHF tuner 50 is also mounted. With this arrangement the UHF tuner 52 is assembled into the main frame 900.

The gear 904 and cam 912 are preferably spring loaded against the mounting bracket 908 by means of a suitable spring washer or the like, so that once the gear 912 is adjusted it will retain its adjusted position despite vibration, etc., when different VHF or UHF stations are selected by rotation of the selector shaft 42. Since the gear 904 and cam 912 must remain in their adjusted UHF fine tuning position, the arcuate slots 906 permit the shaft 44a to rotate slightly as the lever 800 is returned to its inoperative position in which the gear 802 is moved outside of the path of the tuning screws 242.

Referring now more particularly to the operator controllable detent mechanism of the present invention, a detent wheel 920 is secured to the rear end of the selector shaft 42 and is provided with a first series of twelve detent notches 922 and a second set of detent notches 924 which are spaced axially along the shaft 42 from the notches 922. The notches are also offset circumferentially so that they are positioned midway between the notches 922. It should be noted that two separate detent wheels may be employed to provide the notches 922 and 924, if desired.

The detent notches 922 are employed to detent the common selector shaft 42 at twelve equally spaced positions so that as the shaft 42 is rotated through a plurality of revolutions, the UHF tuner 50 is correctly positioned to receive all of the seventy UHF stations in the UHF television band. More particularly, a first torsion spring detent member 926 is provided with a right angle end portion 928 at the rear end thereof which is adapted to ride in the detent notches 922 when the intermediate portion 930 of the detent spring 926, which extends parallel to but is offset from the shaft 42, is torsionally loaded. In a similar manner, the detent notches 924 are employed to detent the common selector shaft 42 at twelve equally spaced positions which are positioned midway between the UHF detent positions established by the detent member 926, in which VHF detent positions the VHF tuner 52 is correctly tuned to receive each of the twelve VHF stations repeatedly during successive rotations of the selector shaft, as described in detail in said Valdettaro U.S. application Ser. No. 776,890. To this end, a second detent member 932 is provided with a right angle end portion 934 at the rear end thereof which is adapted to engage and seat in the notches 924 when the intermediate portion 936 of the detent member 932 is torsionally loaded. The detent wheel 920 is provided with flanges 938 about the periphery thereof which act as guides for the right angle end portions 928 and 934 of the respective detent members 926 and 932.

Figure 1:
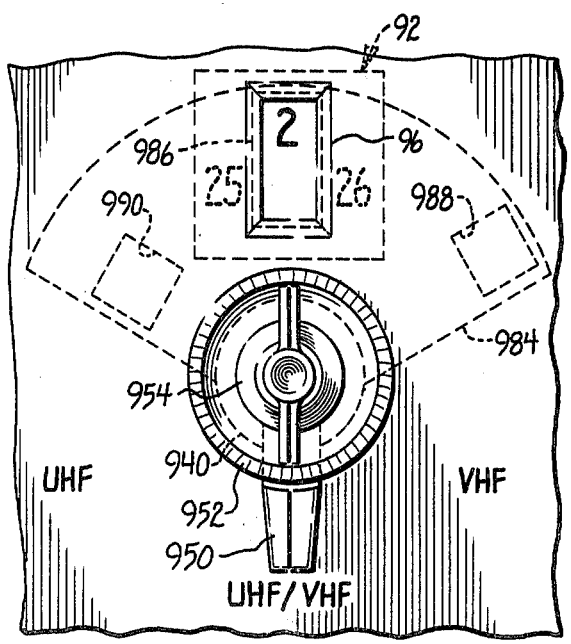
FIG. 1 is a front elevational view of a combination VHF/UHF tuner arrangement embodying the features of the present invention.
Figure 3:
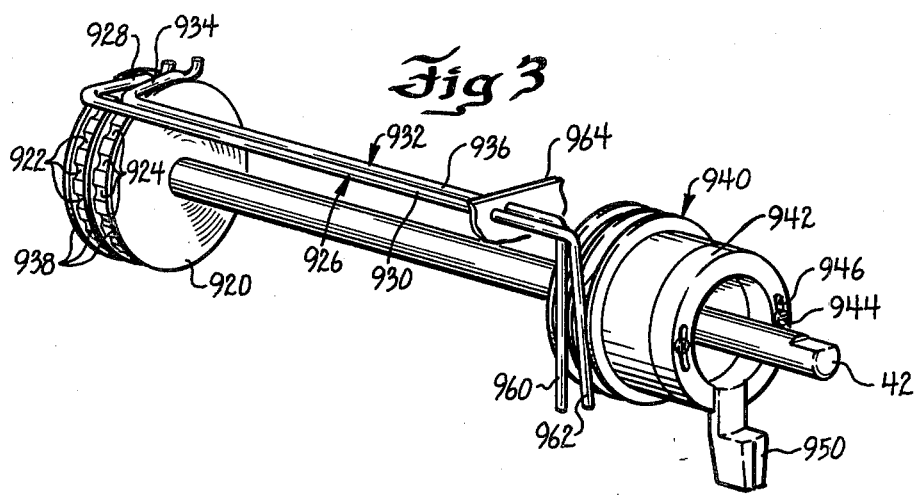
FIG. 3 is a perspective view of the operator-controllable detent mechanism of the tuner of FIG. 1.

In accordance with an important aspect of the present invention, an operator-actuatable member is provided for selectively torsionally-loading either one of the detent members 926 or 932, or both of them, so that the selector shaft 42 may be selectively detented either to receive only VHF stations, only UHF stations, or both VHF and UHF stations. More particularly, a control member indicated generally at 940 is mounted for rotation concentrically with the selector shaft 42. A sleeve member 942, which is secured to the control member 940 by means of the screws 944 and is adjustable with respect thereto within the slots 946, is connected to the control member 940 and extends outwardly through an opening 948 in the front panel 94. The sleeve 942 is provided with the downwardly extending lever portion 950 which is adapted to be grasped by the operator so that the control member 940 may be rotated to different control positions. Specifically, the control lever portion 950 extends downwardly below the fine tuning knob 952 which is secured to the fine tuning shaft 44a and the centrally located channel selector shaft 42, and may be moved from the central position shown in FIG. 1 to either a UHF only position or a VHF only position, as illustrated in FIG. 1. To accomplish selective torsional loading of the detent members 926 and 932 in response to movement of the control member 940, the member 940 includes a pair of separate cam members 956 and 958 which are individually engaged by right angle end portions 960 and 962 on the detent members 932 and 926, respectively. When the control member 940 is in its UHF-VHF central position, the end portions 960 and 962 both ride on the outer portions of the cam members 956 and 958 so that the forward ends of both of the detent members 926 and 932 are torsionally twisted and a substantial detent seating force is exerted on the right angle end portions 928 and 934 thereof so that the shaft 42 is detented in both VHF and UHF positions. In this connection, it will be understood that both the detent member 926 and the detent member 932 are restrained in suitable notches or openings in the front and rear walls of the VHF tuner chassis 52 to provide suitable fulcrums for the torsional loading of the detent members 926 and 932, only a portion of the forward VHF chassis wall 964 being shown in FIG. 3, as will be readily understood by those skilled in the art.

When the control member 940 is moved to the VHF only position shown in FIG. 6, the cutaway section 966 of the cam member 958 permits the right angle end portion 962 of the detent member 926 to move counterclockwise thereby releasing the torsional loading on the detent spring portion 928 so that the end portion 928 is not forced into engagement with the notches 922 and the shaft 42 is no longer detented at positions corresponding to the UHF stations. However, since the detent spring 932 remains torsionally loaded, the shaft 42 may now be detented in twelve equally spaced positions corresponding to the twelve VHF channels, these channels being covered by one full revolution of the channel selector shaft 42 whenever the control member 940 is moved to the VHF only position shown in FIG. 6.

When the control member 940 is moved to the UHF only position shown in FIG. 4, the cutaway sector 968 of the cam member 956 permits the right angle end portion 960 of the detent member 932 to move counterclockwise thereby removing the torsional loading from the detent spring portion 934 so that the shaft 42 is now detented in only twelve equally spaced UHF station positions. Accordingly, when the control member 940 is in the position shown in FIG. 4, any one of the seventy UHF stations may be selected by rotating the shaft 42 somewhat more than five revolutions, as described in detail in said copending U.S. Valdettaro application Ser. No. 776,890.

In order to detent the control member 940 at each of the positions illustrated in FIGS. 4, 5 and 6, a detent ball 970 is adapted to engage any one of three semi-spherical recesses 972 in the periphery of the control member 940, the ball 970 being urged into engagement with any one of the recesses 972 by means of the spring 974.

In order to mount the control member 940 concentrically with the selector shaft 42 while permitting the selector shaft 42 and fine tuning shaft 44a to be freely rotated without interference from the control member 940, the control member 940 is rotatably mounted in an opening 976 in the front wall 140 of the mounting bracket which is secured to the main frame 900 of the combination VHF-UHF tuner. More particularly, the control member 940 is provided with an outwardly extending flange portion 978 which rides on the inner surface of the bracket wall 140 and a "C" washer 980 is employed to retain the control member 940 rotatably mounted within the opening 976. In this connection, it is pointed out that the selective control of the torsional loading on the detent members 926 and 932 by means of the cam members 956 and 958 is conveniently accomplished at the forward end of the combination tuner producing a change in the detent loading on the detent wheel 920 positioned at the rear of the tuner. With this arrangement of the present invention, the detent springs 926, 932 provide a simple and efficient detent control by means of which the operator may selectively control the detent positions of the common selector shaft 42 from the front of the tuner.

When the control member 940 is moved to either the VHF only position or the UHF only position, the channel numbers of the dial indicator 92 which correspond to the undetented stations flash rapidly through the viewing window so that the operator quickly becomes adjusted to concentrating on only the channel numbers corresponding to the detented VHF only or the detented UHF only stations. However, since the channel numbers jump back and forth within the viewing window 96 from VHF to UHF channels as the selector shaft 42 is rotated, this movement of the nondetented channel numbers may cause some annoyance to the operator. If such is the case, this annoyance can be removed by providing a masking member 984 which is mounted on and is rotatable with the control member 940 behind the front panel 94 of the television cabinet. For example, the masking member 984 may be clamped between the forward end of the control member 940 and the sleeve 942 by means of the screws 944. In this connection it is noted that the masking member 984 is not shown in FIG. 3 for purposes of simplification. The masking member 984 is provided with a first vertically-elongated opening 986 which is aligned in coincidence with the viewing window 96 when the control member 940 is in the UHF-VHF position shown in FIG. 1 so that both the VHF channel numbers and the UHF channel numbers are alternately viewable through the window 96 as the selector shaft 42 is moved through twenty-four successive detent positions per revolution. However, when the control member 940 is moved to the VHF only position shown in FIG. 6, the masking member 984 is moved so that only the VHF channel numbers are viewable through the opening 988 in the masking member 984 and the UHF channel numbers are blocked from view by the masking member 984. In a similar manner when the control member 940 is moved to the UHF only position shown in FIG. 4 only the UHF channel numbers of the dial indicator 92 are viewable through the opening 990 in the mask 984.

While the control member 940 has been illustrated as having only three control positions so that the shaft 42 remains detented in either VHF or UHF stations, it will be appreciated that this control member may have a fourth position in which both of the end portions 960 and 962 of the respective detent members 932 and 926 may be released so that the shaft 42 is completely undetented. Such an arrangement may be desirable in situations where the operator wishes to go from one end of the UHF television band to the other which would require approximately five revolutions of the shaft 42. Under such conditions the operator may wish to move the selector shaft rapidly through about five revolutions. By releasing both of the detent members 926 and 932 this rotation may be accomplished smoothly with no detent noise and with the exertion of little force. However, when such a fourth position is provided, it will be necessary to bias the rear end of the shaft 42 against its V-shaped bearing in the rear wall of the VHF tuner chassis 52. This is because the right angle end portions 928 and 934 of the detent members 926 and 932 not only function to provide detent positions for the shaft 42 but also urge the rear end of the shaft 42 into engagement with its bearing in the rear wall of the VHF tuner chassis 52, as described in detail in Valdettaro U.S. Pat. No. 3,234,801. When either one of the detent members 926 or 932 is effective, the shaft 42 is properly seated in its bearing. However, when the torsional loading on both of these members is removed, as in the described fourth position of the member 940, it will be necessary to provide a separate loading force on the rear end of the shaft 42. This may be conveniently provided by a simple wire spring which extends between tabs on the rear wall of the VHF tuner and biases the rear end of the shaft 42 into its bearing, as will be readily understood by those skilled in the art.

It will also be understood that the operator-controllable detent mechanism of the present invention may be employed in seventy-position detent UHF only tuners, in which case only a single detent spring 926 is required. Under these conditions the control member 940 will simply control the selective loading of the conventional single detent wheel on the rear end of the selector shaft of the UHF tuner so that the operator may at his option release the detent force and move quickly from one end of the UHF television band to the other by exerting only a slight force and without the attendant noise of the detent spring engaging the detent notches 922.

While there have been illustrated and described different embodiments of the present invention, it will be apparent that various changes and modifications thereof will occur to those skilled in the art. It is intended in the appended claims to cover all such changes and modifications as fall within the true spirit and scope of the present invention.

I claim:

1. A television tuner arrangement, comprising a station selector shaft, detenting means for exerting a restraining force on said shaft so that it is detented in a plurality of equally spaced detent positions as said selector shaft is rotated, means for receiving different television stations when said selector shaft is in different ones of said equally spaced detent positions, and manually operable means for disabling said detenting means.

2. The tuner arrangement of claim 1, wherein said detenting means includes first and second detent wheels connected to said selector shaft and each having a series of notches in the periphery thereof, a first detent member adapted to be seated in the notches of said first detent wheel with a predetermined force, a second detent member adapted to be seated in the notches of said second detent wheel with a predetermined force, the notches in said first detent wheel being offset with respect to the notches in said second detent wheel so that said selector shaft is successively detented by said first and second detent members in alternate ones of said detent positions, and means controlled by said manually operable means for selectively reducing said predetermined seating force exerted on said first and second detent wheels.

3. The tuner arrangement of claim 2, wherein said receiving means is arranged to receive alternately VHF and UHF television stations in alternate ones of said detent positions.

4. The tuner arrangement of claim 3, wherein said first and second detent members each comprise a single resilient member having an intermediate portion extending generally parallel to said selector shaft and a first right angle end portion urged into engagement with the corresponding one of said first and second detent wheels.

5. The tuner arrangement of claim 4, wherein said manually operable means includes cam means arranged selectively to engage a second right angle end portion of said first and second detent members and rotate the same so that a torsional force is exerted thereon to seat said first right angle end portion in one of the detent wheel notches with said predetermined force.

6. A television tuner arrangement for receiving both VHF and UHF signals, comprising a common VHF and UHF station selector shaft, detent means for establishing a plurality of equally spaced detent positions for said selector shaft by exerting a restraining force on said selector shaft at said detent positions, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, and detent control means for selectively reducing the restraining force of said detent means in either said alternate detent positions or said detent positions between said alternate positions, thereby selectively to permit said selector shaft to be detented only at detent positions corresponding only to VHF stations or detent positions corresponding only to UHF stations.

7. The tuner arrangement of claim 6, wherein said detent control means includes a manually operable control member.

8. The tuner arrangement of claim 7, wherein said control member has a first position in which said restraining force of said detent means is reduced in said alternate detent positions and a second position in which said restraining force of said detent means is reduced in said detent positions between said alternate detent positions.

9. The tuner arrangement of claim 8, wherein said control member has a third position in which the restraining force of said detent means is not reduced in any of said detent positions.

10. The tuner arrangement of claim 9, wherein said third position of said control member is located between said first and second positions thereof.

11. The tuner arrangement of claim 10, which includes means for detenting said control member in each of said first, second and third positions thereof.

12. The tuner arrangement of claim 6, which includes display means operative in said alternate positions to display the VHF channel number of the VHF station received by said VHF tuner means and operative in the positions between said alternate positions to display the UHF channel number of the UHF station received by said UHF tuner means during successive revolutions of said selector shaft, and means controlled by said detent control means for selectively disabling said UHF channel number display means when said selector shaft is detented only in said alternate detent positions.

13. The tuner arrangement of claim 12, which includes means controlled by said detent control means for selectively disabling said VHF channel number display means when said selector shaft is detented only in said detent positions between said alternate detent positions.

14. The tuner arrangement of claim 6, which includes a viewing window, and means for displaying in said window the individual VHF and UHF channel numbers corresponding to the VHF and UHF stations selected by said VHF tuner means and said UHF tuner means during said plurality of revolutions of said selector shaft.

15. The tuner arrangement of claim 6, which includes an elongated strip of material bearing channel numbers corresponding to each of the UHF television stations and a plurality of groups of channel numbers each group corresponding to the VHF television stations, display control means for moving said elongated strip in synchronism with said common selector shaft, and means controlled by said detent control means for masking said UHF channel numbers when said selector shaft is detented only in said alternate detent position.

16. The tuner arrangement of claim 15, which includes means controlled by said detent control means for masking said groups of VHF channel numbers when said selector shaft is detented only in said detent positions between said alternate detent positions.

17. The tuner arrangement of claim 6, wherein said detent control means includes a rotatable control member concentric with said selector shaft.

18. The tuner arrangement of claim 17, which includes an elongated strip of material bearing channel numbers corresponding to each of the UHF television stations and a plurality of groups of channel numbers each group corresponding to the VHF television stations, display control means for moving said elongated strip in synchronism with said common selector shaft, and a masking member connected to and movable with said control member for masking said UHF channel numbers when said selector shaft is detented only in said alternate detent positions.

19. The tuner arrangement of claim 18, wherein said masking member is effective to mask said VHF channel numbers when said selector shaft is detented only in said detent positions between said alternate detent positions.

20. The tuner arrangement of claim 19, which includes means defining a vewing window through which both said VHF and UHF channel numbers may be viewed, said masking member being positioned between said elongated strip and said viewing window.

* * * * *